United States Patent

Tsuda

[15] 3,647,470

[45] Mar. 7, 1972

[54] PHOTOSENSITIVE COMPOSITIONS CONTAINING FURYLACRYLYL-CONTAINING POLYMER

[72] Inventor: Minoru Tsuda, Kanagawa-ken, Japan

[73] Assignee: Agency of Industrial Science and Technology, Tokyo, Japan

[22] Filed: Oct. 21, 1969

[21] Appl. No.: 868,201

Related U.S. Application Data

[63] Continuation-in-part of Ser. No. 554,341, June, 1966, abandoned.

[30] Foreign Application Priority Data

June 9, 1965 Japan....................................40/33784

[52] U.S. Cl...............................................96/115, 96/35.1

[51] Int. Cl............................................................G03c 1/68

[58] Field of Search...........................................96/115, 35.1

[56] References Cited

UNITED STATES PATENTS 3,329,664 7/1967 Tsuda....................................260/91.3

FOREIGN PATENTS OR APPLICATIONS

F18,498 8/1956 Germany....................................96/115
695,197 8/1953 Great Britain............................96/115
794,572 5/1958 Great Britain............................96/115
713,947 8/1954 Great Britain............................96/115
717,708 11/1954 Great Britain............................96/115
717,710 11/1954 Great Britain............................96/115
725,148 3/1955 Great Britain............................96/115

*Primary Examiner*—Ronald H. Smith
*Attorney*—Ernest G. Montague

[57] ABSTRACT

The present invention provides photosensitive compositions of high sensitivity comprising a photosensitive furylacrylyl-containing polymer having a polymerization degree of 500 or more wherein the furylacrylyl group is the photosensitive component of said polymer and wherein said furylacrylyl-containing polymer has been produced by the aqueous alkaline process. The photosensitive compositions are preferably mixtures of a photosensitive polymer and a sensitizer and/or other polymers.

6 Claims, No Drawings

PHOTOSENSITIVE COMPOSITIONS CONTAINING FURYLACRYLYL-CONTAINING POLYMER

REFERENCE TO RELATED APPLICATION

This is a continuation-in-part of my application Ser. No. 554,341 filed June 1, 1966, now abandoned.

BACKGROUND OF THE INVENTION

This invention relates to photosensitive compositions of high sensitivity comprising a photosensitive furylacrylyl-containing polymer having a polymerization degree of 500 or more wherein the furylacrylyl group is the photosensitive component of said polymer and wherein said furylacrylyl-containing polymer has been produced by the aqueous alkaline process.

With regard to photosensitive polymeric compounds, various compositions have been developed up to the present day. Photosensitive resins of the cinnamoyl group based on such cinnamoyl groups as poly(vinyl cinnamate) (including

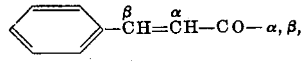

and compositions having one or more permutation groups to an aromatic group) are currently used due to their efficient physical properties and the low cost of industrial application. The invention of producing photosensitive compositions by the addition of a sensitizer to the poly(vinyl cinnamate) obtained by causing the poly(vinyl alcohol) and cinnamic chloride to react in the pyridine is well known. (British Pat. Nos. 695.197, 713,947, 717.710, 717.708 and 725.148)

However, the maximum relative sensitivity of photosensitive resin of the cinnamoyl group thus obtained is 3,300 (proper photosensitivity of the poly(vinyl cinnamate) is taken as 2.2), even if a sensitizer having the maximum sensitive value developed so far is used. In the actual printing or enlarging operations, the above-mentioned photosensitivity is not sufficient and a more superior photosensitive resin having a higher photosensitivity is desirable.

Studies have been made on the utilization of polymeric compositions of the furylacryl group (R—CH = CH—CO—, in which R represents furan chain

and which includes such as contain one or more permutation groups in α, β and in the furan chain) as a photosensitive resin instead of a photosensitive resin of the cinnamoyl group. Various synthesis methods of poly(vinyl furylacrylate) have been developed up to the present day because of its practical usefulness, because the furfural from which the poly(vinyl furylacrylate) is produced is the cheapest in price among the compounds having the furan chains and its production process is comparatively easy.

For example, what is called the pyridine method in which poly(vinyl alcohol) and cinnamic chloride are caused to react in the pyridine is applied to the synthesis of poly(vinyl furylacrylate). In this method, the poly(vinyl alcohol) subjected to swelling by the pyridine is added with the acid chloride and heated for hours at 30°–80° C. Thus, the concentration by esterification is accomplished between the hydroxyl group of the poly(vinyl alcohol) and the acid chloride (British Pat. No. 695.197).

According to this method, however, gelation due to cohesion of poly(vinyl alcohol) takes place with the advancement of esterification in the pyridine to a certain degree. Therefore, the reaction of the hydroxyl group in molecules with the acid chloride cannot be easily accomplished. Furthermore, since the double bond in the furylacrylyl group is higher in reactiveness compared with that in the cinnamoyl group, a side reaction with other functional groups tends to take place under the condition of 30°–80° C. Therefore, in the pyridine method of poly(vinyl furylacrylate) a side reaction tends to take place first of all. Only a polymer having low purity and low esterification degree is obtained. This polymer shows hardly any photosensitiveness. This does not satisfy the quality requirement for poly(vinyl furylacrylate) to be applicable to practical use as a photosensitive resin.

Since the photosensitivity increases in proportion to the polymerization degree, it is necessary to use a photosensitive resin in which the molecular weight of the poly(vinyl alcohol) is 22,000-100,000 and the polymerization degree of the synthesized poly(vinyl furylacrylate) is 500 or more. In the pyridine method, however, the solubility of poly(vinyl alcohol) in the pyridine decreases as the molecular weight of poly(vinyl alcohol) increases. Therefore, the reaction of poly(vinyl alcohol) having the above-mentioned molecular weight becomes impossible.

In reality, the Nagoya Kogyo Kenkyusho Report No. 23,46 (Nagoya Industrial Research Institute, 1963) states that it is impossible to obtain poly(vinyl furylacrylate) having a polymerization degree of more than 500 according to the pyridine method and that even if the reaction temperature is maintained at 30° C., gelation takes place.

Since, as stated above, the synthesis method of poly(vinyl furylacrylate) having a high degree of polymerization has not been developed yet, the study of poly(vinyl furylacrylate) as a photosensitive resin has not up to the present been undertaken, notwithstanding the fact that poly(vinyl cinnamate) has been studied since 1950 and is well known as a superior sensitizer.

There is an example where in quinone and nitrobenzene are used as a sensitizer to poly(vinyl cinnamate) (British Pat. Nos. 713.947, 717.710 and 717.703). However, no study has been made on a sensitizer to poly(vinyl furylacrylate). Furthermore, it is impossible to analogize it from the study of the sensitizer for poly(vinyl cinnamate) because of the difference of the chemical compositions between the furylacrylyl group which is the photosensitive group of poly(vinyl furylacrylate) and the cinnamoyl group which is the photosensitive group of poly(vinyl cinnamate). Therefore, the independent and separate study on a sensitizer for poly(vinyl furylacrylate) was necessary.

The primary object of this invention is to provide a poly(vinyl furylacrylate) which is excellent in photosensitivity.

Another object of this invention is to provide a photosensitive composition excellent in photosensitivity by adding an appropriate sensitizer to the poly(vinyl furylacrylate).

A further object of this invention is to provide a practical photosensitive composition which can be easily produced from a cheap material.

SUMMARY OF THE INVENTION

The inventor has discovered as a result of his study that the poly(vinyl furylacrylate) synthesized by means of the aqueous alkaline process is excellent as a photosensitive resin and serves the above-mentioned purpose. The synthesizing method of the poly(vinyl furylacrylate) through the aqueous alkaline process is already known (U.S. Pat. No. 3,329,664). According to this method, the poly(vinyl alcohol) is dissolved in an aqueous solution of caustic soda and the hydroxyl group of poly(vinyl alcohol) is in a state in which it can be easily attacked by the acid chloride. Therefore, the esterification reaction between the hydroxyl group and the acid chloride is easily accomplished. In addition, since gelation of poly(vinyl alcohol) does not occur, complete esterification is ensured. Also, since reaction is made at a low temperature, no side reactions accompany the esterification. Therefore, the poly(vinyl furylacrylate) synthesized through the aqueous alkaline process is very pure and high in esterification degree. Furthermore, according to this invention, the poly(vinyl furylacrylate) synthesized by this method has an exceedingly high photosensitivity. Accordingly, it has been disclosed that this poly(vinyl furylacrylate) is a superior photosensitive resin.

By way of example, a comparison is given below of the photosensitivity of the poly(vinyl-$\beta$-(2-furyl)acrylate) synthesized through the aqueous alkaline process with that of the poly(vinyl cinnamate) which is known as representative of photosensitive resins of the cinnamoyl group.

| | Photosensitivity |
|---|---|
| Poly(vinyl cinnamate) | 2.2 |
| Sensitized poly(vinyl cinnamate) sensitized by tetraethyl diamino-benzophenon) | 3,300 |
| Poly(vinyl-$\beta$-(2-furyl)acrylate) | 4,400 |

(An ultrahigh-pressure mercury lamp was used as a light source and the test was made in accordance with the grey scale.)

All kinds of commercially available poly(vinyl alcohol) having a polymerization degree of 500–2,600 can be used as the material. The photosensitivity of poly(vinyl furylacrylate) increases in proportion to the polymerization degree of poly(vinyl alcohol). Further, partially saponified substances are generally contained in the poly(vinyl alcohol) and the content of the acetyl groups in commercially available poly(vinyl alcohol) is dispersed between 0–30 mol %. However, efficient poly(vinyl furylacrylate) having superior characteristics can be obtained by means of the aqueous alkaline process, regardless of the content of the acetyl group. The $\beta$-(2-furyl) acrylyl chloride, another material, is a chloride of $\beta$-(2-furyl)acrylic acid which is obtained from furfural in good yield in the same way as cinnamic acid (perkin reaction). Furfural is the cheapest of all compounds having the fran chain and is cheaper as an industrial chemical than benzaldehyde which is the material producing cinnamic acid.

The higher the polymerization degree of the poly(vinyl furylacrylate), the higher the photosensitivity as a photosensitive resin and the better the physical properties. Accordingly, said polymerization degree would be preferably more than 500. In this case, the polymerization degree of poly(vinyl furylacrylate) obtained by the piridine method is very low but the poly(vinyl furylacrylate) having a polymerization degree of 500–2,700 can be easily obtained by means of the aqueous alkaline process.

The inventor has studied polymers containing the furylacrylyl group and other kinds of functional groups in the same polymer chains. For example, the poly(vinyl furylacrylate-vinyl acetate) copolymer obtained when poly(vinyl alcohol) containing 30 mol % of the acetyl group is esterified with furylacrylyl chloride will dissolve into a solvent in which poly(vinyl furylacrylate) homopolymer is not soluble. In other words, if other functional groups such as the acetyl group are introduced, the solubility of the polymer changes and it becomes soluble into many organic solvents. This characteristic feature is very useful in utilizing the photosensitive resin of furylacrylyl acid in the practical field. For example, poly(vinyl furylacrylate) is not dissolved by the chlorine solvents such as trichloroethylene, dichloropropylene, etc. However, poly(vinyl furylacrylate-vinyl acetate) copolymer containing more than 30 mol % of the acetyl group dissolves into these solvents. In the case of there being a risk of fire, an inflammable solvent cannot be used, and the copolymer may be dissolved into an inflammable solvent.

Poly(vinyl furylacrylate-vinyl cinnamate) copolymer into which the cinnamoyl group has been introduced is very interesting. In the case where the mol ratio of the copolymer compound, comprising vinyl furylacrylate and vinyl cinnamate, shows 4:3, the photosensitivity will be decreased to one third of that of poly(vinyl furylacrylate), if a sensitizer is not added into this copolymer. When a sensitizer is added, the photosensitivity will become nearly equal to that of poly(vinyl furylacrylate) to which a sensitizer is added. Accordingly, the dissolving property of this copolymer can be made to approach that of poly(vinyl cinnamate) and the photosensitivity can be made to approach that of the poly(vinyl furylacrylate) by introducing the cinnamoyl group in a polymer. Therefore, a high photosensitive resin can be used by utilizing the conventional application technique of the poly(vinyl cinnamate).

The polymer developable with the aqueous alkaline process can be produced by esterifying one acid radical of the dichroline acid such as succinic acid, phthalic acid, maleic acid, etc., and leaving another acid radical as free acid.

Furthermore, according to this invention, the photosensitivity of photosensitive resins based on the furylacrylyl group such as described above can be considerably improved by the addition of a sensitizer. In the capacity of a sensitizer, aromatic nitro compounds such as 4-nitroacetanilide, 2-nitrofluorene, 4-nitroaniline, etc., and aromatic ketones such as NNN'N'-tetramethyl-4, 4'-diaminobenzophenone-anthraquinone, bezophenone, etc., give stronger sensitizing effects. If these compounds are added at the rate of 10 wt. % of the photosensitive resin, the photosensitivity thereof considerably increases. If this photosensitivity value is converted to the photosensitivity system in which that of the photosensitive resin based on the cinnamic acid is taken as the standard value, it will amount to 89,100.

Below is shown an example.

| Photosensitive resin | Photosensitivity |
|---|---|
| Poly(vinyl cinnamate) (sensitized by 5-nitroacenaphthene), standard | 1,100 |
| Poly(vinyl furylacrylate) | 4,400 |
| Poly(vinyl furylacrylate) (sensitized by NNN'N'-tetramethyldiaminobenzophenone) | 89,100 |

The solution of the poly(vinyl furylacrylate), poly(vinyl furylacrylate-vinyl cinnamate), poly(vinyl furylacrylate-vinyl acetate), etc., can be freely mixed with the solution of novolak, resol and epoxy resin. The solution thus obtained can be used as a photosensitive resin. These resin mixtures are hardened by heating through the cross-linking effect. What is called "burning effect" considerably improves the chemical resisting and the corrosion resisting properties of the resin.

The description of this invention has been made on the poly(vinyl furylacrylate) only. From the fact that the photosensitive construction is of the dimerization (or the polimerization of more than that) of the furylacrylyl group, the same effect can be expected from other polymers having the same photosensitive group.

The photosensitive resin based on the furylacrylyl group according to this invention possesses a very high photosensitivity and the resolving power thereof is extremely superior, being more than 50 lines/mm. In addition, the physical characteristics such as the adhesion properties are of a higher level. Consequently, this resin has a wide range of application as a photosensitive composition; for example, in marking off steel plate or in manufacturing printing plates to be used for offset printing. Also, it can be used in an optical marking-off device or as a photosensitive resin for a photocomposing device to be used in manufacturing offset printing raw plates or as a sensitizing material for enlargement.

DESCRIPTION OF PREFERRED EMBODIMENTS

The following Examples are further illustrative of this invention, and it will be understood that the invention is not limited thereto.

Example 1

138g. of $\beta$-(2-furyl)acrylic acid was added to a mixture of thionyl chloride (230 g.) and anhydrous benzene (500 cc.) after it was heated up to 70° C. The mixture was then stirred for 3 hours, benzol was extracted first and furylacrylyl chloride afterward (2mm. Hg, 87° C). Then, 21.9 g. of furylacrylyl chloride was dissolved into 140 cc. of methylethyl ketone which was cooled afterward.

On the other hand, 4.4 g. of poly(vinyl alcohol) (Polymerization degree 2,600; Saponification degree, 99.6 mol %) was dissolved into 100 cc. of water and aqueous sodium hydroxide (100 cc.) with methylethyl ketone (100 cc.) added thereto. After the above treatment, the mixture was cooled down to −7° C.

Then, while mixing the poly(vinyl alcohol) solution, furylacrylyl chloride solution was gradually added during the mixing operation which was maintained for 90 minutes. The above reaction was carried out at a temperature of −8° C.

After the reaction, the solution which was kept in a static state, separated into two layers within several minutes. In this case, the polymer was not found in the bottom layer but in the upper layer. After that, the solution of the upper layer was taken out therefrom for use as the photosensitive solution.

When the photosensitive solution was dropped into the water, a polymer having a yellow color was precipitated. Said polymer is also soluble with methylethyl ketone, methyl cellosolve and the polymer solution is quite stable and free from the dark reaction even after 1 year.

The photosensitive solution was coated on the printing magnesium plate and dried by an infrared lamp. After that, a negative image which was fixed had been exposed on the ultrahigh-pressure mercury lamp for 30 seconds at a distance of 25 cm. And then, it was developed by dipping into the methylethyl ketone for 2 minutes. From the above process, a perfect positive image was obtained after drying.

Further, comparative test data is set out below, in connection with the photosensitivity between the conventional poly(vinyl cinnamate) (Polymerization degree, 2,600) and the photosensitive solution obtained from this example.

| Photosensitive solution | | Photosensitivity |
|---|---|---|
| Photosensitive solution obtained from this Example | | 4,400 |
| Poly(vinyl cinnamate) | 0.5 g. | 2.2 |
| Ethyl cellosolve acetate | 10.0 cc. | |
| Poly(vinyl cinnamate) | 0.5 g. | |
| Tetra ethyl diamino benzophenone | 0.05 g. | 3,300 |
| Ethyl cellosolve acetate | 10.0 cc. | |

The above results have been derived from the test in which the three photosensitive solutions were measured by the grey scale method (Kodak Step Tablet No. 2; Ultrahigh-pressure mercury lamp).

Example 2

Michler's ketone (N,N,N',N'-tetraethl-4,4'-diaminobenzophenone) as sensitizer to the photosensitive solution obtained by the same manner as described in Example 1, the photosensitive solution of poly(vinyl furylacrylate) synthesized by the pyridine method and the photosensitive solutions of poly(vinyl cinnamate) synthesized by the pyridine method, respectively. The photosensitivity test of the photosensitive resins thus obtained was carried out. The results were as follows.

| Photosensitive resin | Sensitizer | Photosensitivity |
|---|---|---|
| Poly(vinyl cinnamate) (pyridine method) | Michler's ketone | 600 |
| Poly(vinyl furylacrylate) (pyridine method) | Michler's ketone | - 3,000- 2ı 1-3,800 |
| Poly(vinyl furylacrylate) (aqueous alkaline process) | Michler's ketone | 89,100 |

It was found from the above that, where Michler's ketone was used as sensitizer, the resulting photosensitivities of the resin were considerably different and that a remarkable effect could be attained with poly(vinyl furylacrylate) synthesized by the aqueous alkaline process.

The reason for this is that Michler's ketone is very photosensitive with respect to impurities. As pure polymers cannot be obtained by the pyridine method, the photosensitivity is low and the photosensitivity of poly(vinyl furylacrylate) is insufficient for it to be used as synthetic resin in marking off a steel plate. On the other hand, the photosensitivity of poly(vinyl furylacrylate) synthesized by the aqueous alkaline process is remarkably high and the poly(vinyl furylacrylate) is sufficient for it to be used as a highly photosensitive resin.

Example 3

The poly(vinyl furylacrylate) obtained in the manner in accordance with Example 1 was dissolved into methyl cellosolve, whereby 10 wt. % solution was obtained. To the resulting solution were added various sorts of sensitizers at 10 wt. % of the solid part of the resin. After that, the photosensitive test was carried out by means of the grey scale method. With regard to the standard, the poly(vinyl cinnamate) the photosensitivity of which had been increased by 5-nitroacenaphthene was used.

The results therefrom are shown below.

| Sensitizer | Photosensitivity |
|---|---|
| (Aromatic nitro compounds) | |
| 4-nitroaniline | 9,900 |
| 2-nitrofluorene | 44,550 |
| 5-nitroacenaphthene | 29,700 |
| 2.6-dichloro-N,N-dimethyl-4-nitroaniline | 9,900 |
| 2.6-dibromo-N,N-dimethyl-4-nitroaniline | 14,850 |
| 4-nitroacetanilide | 14,850 |
| N-acetyl-4-nitro-1-naphthylamine | 29,700 |
| (Aromatic Ketones) | |
| Jodeosin | 4,950 |
| N,N,N',N'-tetramethyl-4-4'-diaminobenzophenone | 89,100 |
| N,N,N',N'-tetraethyl-4.4'-diaminobenzophenone | 89,100 |
| N,N-dimethyl-4-amino-benzophenone | 44,550 |
| Anthraquinone | 29,700 |
| Methylanthraquinone | 9,900 |
| Ethylanthraquinone | 44,550 |
| Amilanthraquinone | 44,550 |

The photosensitive solution obtained in accordance with the present invention has an efficient coating durability, besides having clear images and is of sufficient quality for using the photosensitive resin for producing industrial material, such as offset printing plates, etc., as much as the poly(vinyl cinnamate).

Example 4

10 g. of furylacrylyl chloride and 10 g. of cinnamoyl chloride were dissolved into 1,400 cc. of methylethyl ketone and the mixture was then cooled.

On the other hand, 4.4 g. of poly(vinyl alcohol) (Polymerization degree, 2,600; Saponification degree, 99.6 mol %) was dissolved into 100 cc. of water and to said mixture solution was added a 16 percent aqueous sodium hydroxide (100 cc.) and methylethyl ketone (100 cc.). Said mixture solution was then cooled.

The former solution was then gradually added to the latter solution and stirred for 90 minutes. During the above treatment, the temperature was maintained at −8° C. After the above reaction, same treatment as Example 1 had been achieved and the photosensitive test was carried out.

The polymer which has been obtained therefrom can be utilized in the same way as the poly(vinyl cinnamate) by dissolving into trichloroethylene, ethl cellosolve mono acetate, dichloro propylene, etc.

| Photosensitive solution | Photosensitivity |
|---|---|
| Poly(vinyl furyacrylate) | 4,400 |
| Poly(vinyl furylacrylate-vinyl cinnamate) | 1,500 |
| 5-nitroacenaphthene sensitizer: | |
| Poly(vinyl furyacrylate) | 29,700 |
| Poly(vinyl furylacrylate-vinyl cinnamate) | 29,700 |
| Michler's ketone sensitizer: | |
| Poly(vinyl furyacrylate) | 89,100 |
| Poly(vinyl furylacrylate-vinyl cinnamate) | 44,500 |

In the case when the photosensitivity was increased by the use of 5-nitroacenaphthene, exactly the same result in respect of the photosensitivity between poly(vinyl furylacrylate) and poly(vinyl furylacrylate-vinyl cinnamate) was obtained. Particularly, in the case of 5-nitroacenaphthene, the photosensitive effect thereof will not decrease even if the impurities are contained therein, and is thereof suitable for industrial usage.

Further, in the case of poly(vinyl furylacrylate-vinyl cinnamate), the adhesive property to the surface of metal materials is superior to poly(vinyl cinnamate) together with its efficient flexibility and it is therefore more suitable for use in the metal working process.

Example 5

4 g. of copolymer which was obtained from Example 4, was dissolved into 100 cc. of ethylcellusolve acetate together with 6 g. of resol(Hitanol 2,181 S, Hitachi Chemical Industry) and 1 g. of 5-nitroacenaphthene. The photosensitivity of the above solution was 29,700.

In the next, said solution was coated on the printing zinc plate for manufacturing a zinc relief. The result of the test proves that it can be used in the same way as poly(vinyl cinnamate).

Example 6

4.5 g. of the copolymer which was obtained from Example 4, was dissolved into 100 cc. of ethyl cellosolve acetate together with 0.5 g. of epoxy resin (Araldite 6,099, Ciba Chemical Industry) and 0.5 g. of 5-nitroacenaphthene. The photosensitivity of the above solution was 29,700.

Then, a relief was manufactured by the use of the above solution, the result of which shows that the relief manufactured by that method can be used in the same as that manufactured by the poly(vinyl cinnamate). The adhesive properties thereof were superior to the poly(vinyl cinnamate).

Further, when the solution was used for manufacturing an aluminum plate, the antialkaline property was far greater than that of the poly(vinyl cinnamate), in addition, it is very durable to electrolytic polishing.

Example 7

The poly(vinyl furylacrylate-vinyl cinnamate) obtained from Example 4 with epoxyl resin 10 wt. % addition strengthened its antialkaline property for producing alminum plate by means of a heat treatment at 80° C.

Further, the poly(vinyl furylacrylate-vinyl cinnamate) in which 50 wt. % of novolak or resol was added showed an efficient value against the dow corrosion through the burning process in the case that the zinc plate was produced. It was effective to use the sensitizer for those resins which was mixed together.

Furthermore, no lowering of the photosensitivity was made even if there was large amounts of materials which did not have an photosensitive property. Namely, in accordance with the experimental result, no lowering effect of the photosensitivity had been measured even in the case in which only 40 wt. % of the photosensitive polymer was used.

What I claimed is:

1. A photosensitive composition of high sensitivity comprising a furylacrylyl-containing polymer having a polymerization degree of 500 or more, the furylacrylyl group being the photosensitive component of said polymer, and said furylacrylyl-containing polymer being a furylacrylyl ester of a vinyl polymer.

2. The photosensitive composition of high sensitivity comprising a composition selected from the group consisting of (i) at least one furylacrylyl-containing photosensitive polymer and at least one sensitizer, (ii) at least one furylacrylyl-containing photosensitive polymer and at least one other polymer, and (iii) at least one furylacrylyl-containing photosensitive polymer together with at least one sensitizer and at least one other polymer; wherein said furylacrylyl photosensitive polymer is the furylacrylyl ester of a vinyl polymer and has a polymerization degree of 500 or more.

3. The photosensitive composition of claim 2, wherein said furylacrylyl ester of a vinyl polymer having a polymerization degree of 500 or more is produced by the aqueous alkaline process.

4. The photosensitive composition of claim 2, wherein said sensitizer is selected from the group consisting of aromatic nitro compounds and aromatic ketones.

5. The photosensitive composition of claim 2, wherein said at least one other polymer is selected from the group consisting of novolak, resol and epoxy resin.

6. The photosensitive composition of claim 2, wherein said furylacrylyl ester of a vinyl polymer is selected from the group consisting of poly(vinyl furylacrylate), poly(vinyl furylacrylate-vinyl cinnamate) copolymer, poly(vinyl furylacrylate-vinyl acetate) copolymer, and poly(vinyl furylacrylate-vinyl cinnamate-vinyl acetate) copolymer.

* * * * *